United States Patent
Mauder

(10) Patent No.: US 11,887,848 B2
(45) Date of Patent: Jan. 30, 2024

(54) NUCLEATION LAYER DEPOSITION METHOD

(71) Applicant: AIXTRON SE, Herzogenrath (DE)

(72) Inventor: Christof Martin Mauder, Aachen (DE)

(73) Assignee: AIXTRON SE, Herzogenrath (DE)

( * ) Notice: Subject to any disclaimer, the term of this patent is extended or adjusted under 35 U.S.C. 154(b) by 779 days.

(21) Appl. No.: 17/046,714

(22) PCT Filed: Apr. 10, 2019

(86) PCT No.: PCT/EP2019/059010
§ 371 (c)(1),
(2) Date: Apr. 23, 2021

(87) PCT Pub. No.: WO2019/197433
PCT Pub. Date: Oct. 17, 2019

(65) Prior Publication Data
US 2022/0051893 A1 Feb. 17, 2022

(30) Foreign Application Priority Data
Apr. 11, 2018 (DE) ...................... 10 2018 108 604.0

(51) Int. Cl.
*H01L 21/02* (2006.01)
*C23C 16/02* (2006.01)
(Continued)

(52) U.S. Cl.
CPC .... *H01L 21/02576* (2013.01); *C23C 16/0218* (2013.01); *C23C 16/303* (2013.01);
(Continued)

(58) Field of Classification Search
CPC ................................................ H01L 21/02381
See application file for complete search history.

(56) References Cited

U.S. PATENT DOCUMENTS

| 9,917,156 B1 | 3/2018 | Laboutin et al. |
| 2002/0117104 A1 | 8/2002 | Hata et al. |

(Continued)

FOREIGN PATENT DOCUMENTS

JP 2013030725 A 2/2013

OTHER PUBLICATIONS

International Search Report dated Jul. 3, 2019, from the ISA/European Patent Office, for International Application No. PCT/EP2019/059010 (filed Apr. 10, 2019), 9 pgs.

(Continued)

*Primary Examiner* — Douglas M Menz
(74) *Attorney, Agent, or Firm* — Ascenda Law Group, PC

(57) ABSTRACT

A nucleation layer comprised of group III and V elements is directly deposited onto the surface of a substrate made of a group IV element. Together with a first gaseous starting material containing a group III element, a second gaseous starting material containing a group V element is introduced at a process temperature of greater than 500° C. into a process chamber containing the substrate. It is essential that at least at the start of the deposition process of the nucleation layer, a third gaseous starting material containing a group IV element is fed into the process chamber, together with the first and second gaseous starting material. The third gaseous starting material develops an n-doping effect in the deposited III-V crystal, which causes a decrease in damping at a dopant concentration of less than $1\times10^{18}$ cm$^{-3}$.

18 Claims, 2 Drawing Sheets

(51) Int. Cl.
  *C23C 16/30*    (2006.01)
  *C30B 25/16*    (2006.01)
  *C30B 25/18*    (2006.01)
  *C30B 29/40*    (2006.01)
  *H01L 29/207*   (2006.01)
  *H01L 29/66*    (2006.01)
  *H01L 29/778*   (2006.01)
  *H01L 29/20*    (2006.01)
  *H01L 29/205*   (2006.01)

(52) U.S. Cl.
  CPC .......... *C30B 25/165* (2013.01); *C30B 25/183* (2013.01); *C30B 29/403* (2013.01); *H01L 21/0254* (2013.01); *H01L 21/0262* (2013.01); *H01L 21/02381* (2013.01); *H01L 21/02458* (2013.01); *H01L 21/02502* (2013.01); *H01L 29/207* (2013.01); *H01L 29/66462* (2013.01); *H01L 29/7786* (2013.01); *H01L 29/2003* (2013.01); *H01L 29/205* (2013.01)

(56) References Cited

U.S. PATENT DOCUMENTS

| | | |
|---|---|---|
| 2003/0092263 A1 | 5/2003 | Koike et al. |
| 2012/0326160 A1 | 12/2012 | Yanagihara et al. |
| 2015/0076509 A1 | 3/2015 | Ishiguro et al. |
| 2018/0069085 A1 | 3/2018 | Laboutin et al. |
| 2019/0027426 A1* | 1/2019 | Chu .................. H01L 29/0653 |
| 2023/0104038 A1* | 4/2023 | Liu .................. H01L 29/66462 |
| | | 257/20 |

OTHER PUBLICATIONS

Written Opinion dated Jul. 3, 2019, from the ISA/European Patent Office, for International Application No. PCT/EP2019/059010 (filed Apr. 10, 2019), 9 pgs.

Thapa; et al. "Growth and studies of Si-doped AlN-layers", Journal of Crystal Growth, vol. 310, Issue 23, Nov. 15, 2008, pp. 4939-4941.

* cited by examiner

NUCLEATION LAYER DEPOSITION METHOD

RELATED APPLICATIONS

This application is a National Stage under 35 USC 371 of and claims priority to International Application No. PCT/EP2019/059010, filed 10 Apr. 2019, which claims the priority benefit of DE Application No. 10 2018 108 604.0, filed 11 Apr. 2018.

FIELD OF THE INVENTION

The invention relates to a method for depositing a nucleation layer comprised of elements of the main groups III and V directly onto the surface of a substrate made of an element of the main group IV, wherein a second gaseous starting material containing the element of the main group V is introduced together with a first gaseous starting material containing the element of the main group III into a process chamber containing the substrate at a process temperature greater than 500° C. At least at the start of the deposition of the nucleation layer, a gaseous starting material containing an element of main group IV is fed into the process chamber, creating a doping effect in the layer.

The invention further relates to a layer sequence produced on the basis of the method, in particular a HFET transistor.

BACKGROUND

A species-related method is described in document JP 2013030725 A. According to this method, silicon in high concentration should be introduced into the nucleation layer as a dopant besides the element in main group III and V in order to inhibit mechanical distortion.

HFETs (High Electron Mobility Transistor) or Heterostructure Field-Effect Transistors are constructed with a layer sequence in which a nucleation layer of AlN is first deposited on a silicon substrate. A buffer layer of GaN is deposited on the nucleation layer. An AlGaN layer is deposited on the buffer layer as the active layer, so that a two-dimensional electron gas forms between the active layer and the buffer layer.

An alternative method for producing HEMTs is described in document U.S. Pat. No. 9,917,156 B1. A nucleation layer of silicon is first deposited on a silicon substrate. The silicon nucleation layer has a p-conductive property because of contamination in the process chamber, which is attributable to gallium, aluminum or the like adhering to the walls of the process chamber. The p-doping must be counterbalanced by the doping of the nucleation layer with metal. A III-V buffer layer is deposited on the silicon nucleation layer.

When a III-V nucleation layer is deposited on the substrate, a boundary surface with high electrical conductivity forms between the nucleation layer and the substrate. The formation of this electrically conductive boundary layer is attributed among other reasons to the relatively high temperature at which the nucleation layer (AlN layer) is deposited. The cause of this conductivity has not yet been fully explained. A diffusion of atoms through boundary surfaces of two adjacent layers may also stimulate the electrical conductivity. Added to this, strong internal electrical fields may also have the effect of concentrating charge carriers on the boundary surface. This phenomenon of increased conductivity in the boundary surface between nucleation layer and substrate significantly impairs the properties of the constituent elements at high switching frequencies due to dispersion or damping.

The paper "Growth and studies of Si-doped AlN-layers, Journal of crystal growth 310 (2008) 4939-4941" describes the deposition of a silicon-doped AlN layer on a substrate consisting of sapphire, wherein silane is used as the dopant.

Patents US 2002/0117104 A1 and US 2003/0092263 A1 describe methods for depositing III- and V-semiconductor layers.

SUMMARY OF THE INVENTION

The problem the invention is intended to address is to describe measures with which the parasitic dispersion effects may be reduced in particular in a GaN-based HFET constituent element structure.

The problem is solved with the method described in the claims and the claimed layer structure.

The subordinate claims not only represent advantageous refinements of the main claims, but also standalone solutions to the problem.

Firstly and essentially, the dispersion or damping is reduced by a modification of the deposition parameters during the growth of the nucleation layer. Firstly and essentially, it is suggested that at least at the start of deposition of the nucleation layer a third gaseous starting material is fed into the process chamber together with the first and second gaseous starting materials, wherein the third gaseous starting material develops a certain doping effect. The first and second gaseous starting materials are fed into the process chamber in such a way that a stoichiometrically correct multicomponent crystal, in particular a III-V crystal, is deposited on the substrate surface. In a preferred variant of the invention, the substrate is a silicon substrate with a (111)- or (110)-orientation. The element of the main group III may be aluminum, but also gallium or indium; the element of the main group V may be nitrogen, but also arsenic or phosphorus. The first gaseous starting material may be an organometallic compound containing aluminum, gallium or indium, for example TMAl. The second gaseous starting material may be a V-hydrogen compound, in particular a nitrogen-hydrogen compound, for example $NH_3$. The process temperatures at which deposition of the nucleation layer takes place in which aluminum and nitrogen are incorporated preferably in a ratio of 1:1, are in the range 800 and 1,200° C. The deposition process is carried out under total pressure of 30 to 300 mbar. In a preferred variant, the molar ratio between the second gaseous starting material and the first gaseous starting material, that is to say between the nitrogen compound and the aluminum compound, is about 10 to 5,000. The growth rate of the nucleation layer, which is adjusted by means of the partial pressure of the first gaseous starting material (main group III) is preferably between 0.01 and 2 µm/h. According to the invention, a third gaseous starting material is fed into the process chamber in addition to the two gaseous starting materials which form the crystal matrix, which third starting material results in an n-doping, in particular a weak n-doping, wherein the concentration of dopant in the layer is less than $1 \times 10^{19}$ $cm^{-3}$. This third starting material, which has the function of a dopant, may be fed in either throughout the process of depositing the nucleation layer or equally only for part of the nucleation layer deposition process, at the start thereof. Suitable starting materials are the hydrogen compounds of silicon or germanium. For example, the third gaseous starting material may have a structural formula equivalent to $Si_nH_{2n+2}$ or $Ge_nH_{2n+2}$. In general, any gaseous starting material containing silicon or germanium is eligible for consideration. The partial pressure of the third gaseous starting material or the gas flow of the third gaseous starting material into the process chamber is preferably set so that the dopant level is in the range from $1\times10^{17}$ to $1\times10^{18}$ cm$^{-3}$. In a preferred method, an AlN nucleation layer is deposited on the surface of a silicon substrate by feeding a silicon-hydrogen compound or a germanium-hydrogen compound, for example silane or germane, into the process chamber together with TMAl and NH$_3$.

In a further development of the invention, it is suggested that a buffer layer consisting of the material system of the group III nitrides, in particular AlN, GaN, InN, AlGaN, InGaN or AlInGaN be deposited on the nucleation layer. The further layers may also be doped. Silicon may also be considered for use as the dopant. One or more further active layers, which are necessary for producing a heterostructure field effect transistor with a two-dimensional electron gas between an active layer and the buffer layer, for example, or between two active layers, may be deposited on the at least one buffer layer. Particularly GaN/AlN, GaN/AlGaN, GaN/AlInN, InGaN/AlN, InGaN/GaN and/or InGaN/AlInN heterostructures are suitable for this.

Experiments with structures for which a nucleation layer was deposited in the manner described previously resulted in substantially reduced damping. The measured high frequency damping (forward transmission $S_{21}$) of a coplanar line which was deposited on an approximately 200 nm thick AlN layer on a Si substrate has a substantially lower damping value with a dopant level not exceeding $10^{18}$ cm$^{-3}$.

The invention relates further to a layer sequence produced by the method, which consists of a III-V nucleation layer deposited on a silicon substrate, which is doped with an element of main group IV. The nucleation layer supports at least one buffer layer made of a III-V material. A two-dimensional electron gas forms between a buffer layer and an active layer.

BRIEF DESCRIPTION OF THE DRAWINGS

In the following text, an exemplary embodiment of the invention will be explained with reference to accompanying drawings. In the drawings.

DETAILED DESCRIPTION

Figure 1:
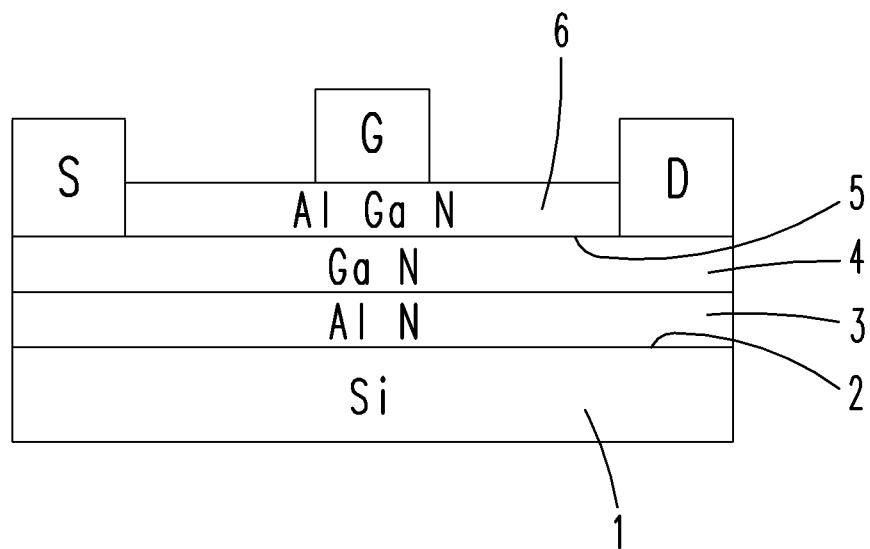
FIG. 1 is a schematic representation of the layer structure of a high electron mobility transistor.
Figure 2:
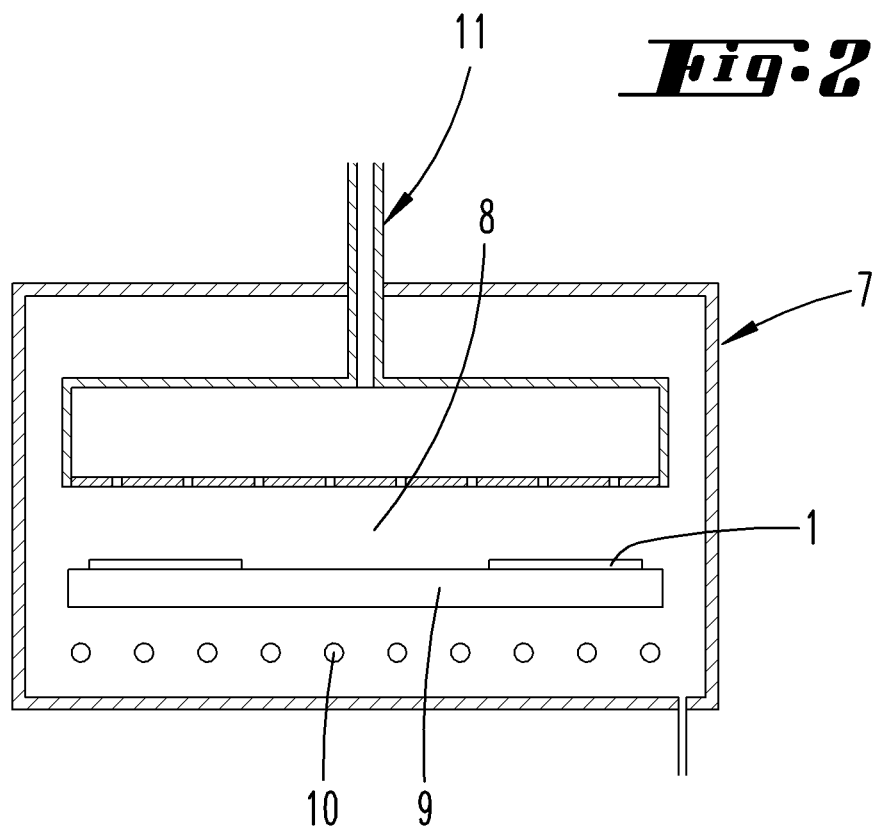
FIG. 2 is a schematic representation of a CVD reactor for depositing the layer sequence represented in FIG. 1.

FIG. 1 is a schematic representation of the structure of a HEMT on which a nucleation layer 3 has been deposited on the surface 2 of a silicon substrate 1. The surface 2 of the silicon substrate 1 is prepared appropriately before the nucleation layer 3 is deposited. For this purpose, the silicon substrate 1 is introduced into a process chamber 8 of a CVD reactor 7. It is heated to a temperature of 900 to 1,200° C. under a typical total pressure between 50 and 800 mbar in a hydrogen atmosphere. During this preparatory step, the natural SiO$_2$ layer of the substrate is thermally removed. This is followed by an optional further pretreatment of the substrate at lower or higher temperature and adjusted pressure with for example TMAl or NH$_3$ or other gaseous starting materials.

The actual epitactic application of the AlN nucleation layer 3 is performed by simultaneously introducing TMAl and NH$_3$. The nucleation layer 3 may be deposited in a multistage process, wherein the temperature, pressure and gas flows may be altered. The temperature range for the deposition of the nucleation layer 3 is typically in the region between 800 and 1,200° C., while the total pressure inside the process chamber 8 is in the range between 30 and 300 mbar.

The gaseous starting materials are fed into the process chamber 8 together with a carrier gas, hydrogen for example, through a gas inlet member 11. One or more substrates 1 are present in the process chamber 8 on a susceptor 9 which is heated by a heating device 10 and are coated with the nucleation layer 3. The gaseous precursors, in particular TMAl and NH$_3$, are fed into the process chamber 8 through the gas inlet member 11 in a molar ratio for V starting material to III starting material in the range of 10 to 5,000. The flow rates of the gaseous starting materials are adjusted such that the growth rage of the AlN nucleation layer 3 is in the range between 0.01 and 2 µm/h.

However, it is essential to the invention that during the deposition of the nucleation layer 3, but at least at the start of the deposition of the nucleation layer 3, a further gaseous starting material is fed into the process chamber 8, resulting in a weak n-conductivity. This third gaseous starting material is preferably silane or germanium with the structural formula $Si_nH_{2n+2}$ or $Ge_nH_{2n+2}$.

Figure 3:
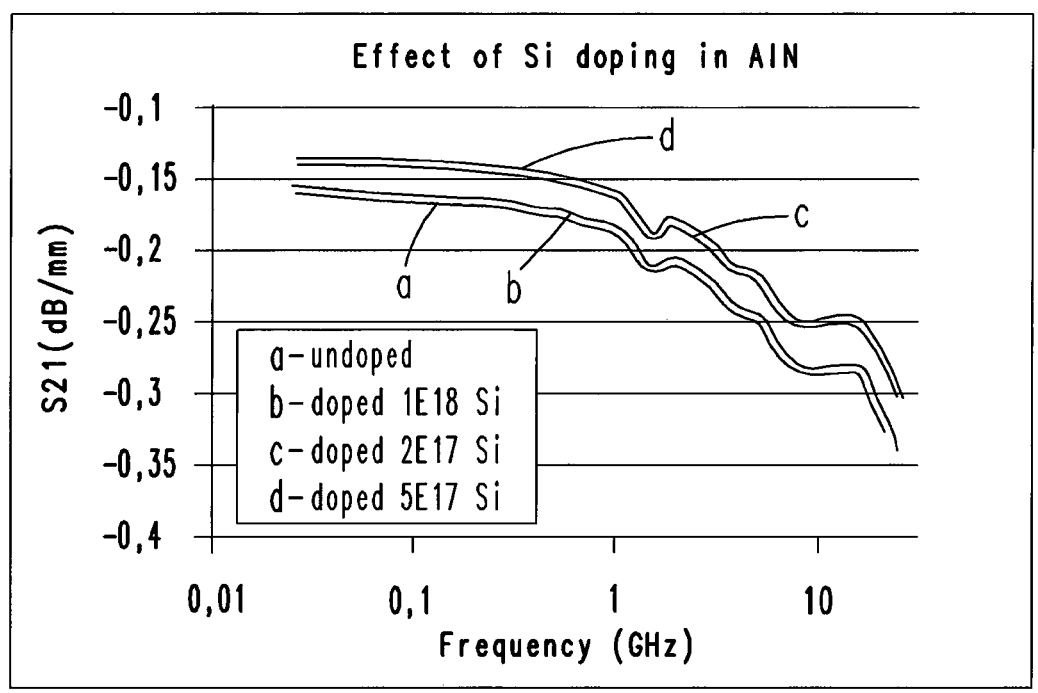
FIG. 3 shows the $S_{21}$ damping parameter of a coplanar line on an AlN/Si structure with various dopants in the AlN layer.

The additional n-doping of the III-V nucleation layer results in a substantial reduction in the dispersion effects described in the introduction and a decrease of the damping, as is shown in FIG. 3 by the examples a) undoped AlN,
b) $1\times10^{18}$ cm$^{-3}$ doped AlN or
c) $2\times10^{17}$ cm$^{-3}$ doped AlN
d) $5\times10^{17}$ cm$^{-3}$ doped AlN.

FIG. 3 shows a significant decrease in damping at dopant concentrations of $2\times10^{17}$ cm$^{-3}$ and $5\times10^{17}$ cm$^{-3}$, whereas with more doping of $1\times10^{18}$ cm$^{-3}$ the damping increases again and reaches roughly the same value as the undoped AlN.

The results show that the desired effect is evidently not detectable at higher dopant concentrations.

After this, first a GaN buffer layer 4 and then an active AlGaN layer 6 are deposited in known manner on the nucleation layer 3, with the result that a two-dimensional electron gas forms on the boundary surface 5 between buffer layer 4 and active layer 6. Gate contacts, source contacts and drain contacts are also produced in known manner.

The preceding notes are intended to provide an explanation of the inventions collected altogether in the application, which advance the prior art at least by the following combinations of features, as well as independently in each case, wherein two, more, or all of said feature combinations may themselves be combined, namely:

A method which is characterized in that at least at the start of the deposition of the nucleation layer 3, a third gaseous starting material containing an element of main group IV is fed into the process chamber 8 together with the first and second gaseous starting materials.

A method which is characterized in that the partial pressure of the third gaseous starting material is lower than the partial pressures of the first and second gaseous starting materials in the process chamber 8 by a factor of at least 10, and/or that the partial pressure or the mass flow of the third gaseous starting material in the process chamber 8 is selected such that it results in a doping not exceeding $1\times10^{18}$ cm$^{-3}$.

A method which is characterized in that the process temperature is in a range between 800° C. and 1,200° C., preferably between 950° C. and 1,050° C.

A method which is characterized in that the nucleation layer 3 is deposited under total pressures between 30 and 300 mbar.

A method which is characterized in that the molar ratio of the second gaseous starting material to the first gaseous starting material is in the range between 10 and 5,000.

A method which is characterized in that the addition of the third gaseous starting material causes an n-doping of the nucleation layer in the range from $1\times10^{17}$ to $1\times10^{18}$ cm$^{-3}$.

A method which is characterized in that the substrate (1) consists of silicon or germanium, and/or that the third gaseous starting material is Si$_n$H$_{2n+2}$ or Ge$_n$H$_{2n+2}$ or another gaseous starting material that contains silicon or germanium.

A method which is characterized in that the element of the main group III is Al and/or the first gaseous starting material is TMAl.

A method which is characterized in that the element of the main group V is nitrogen and/or the second gaseous starting material is NH$_3$.

A method which is characterized in that a buffer layer 4, particularly of AlN, is deposited on the nucleation layer 3, and an active layer 6 is deposited on the buffer layer 4 in such manner that a two-dimensional electron gas develops on the boundary surface 5 between active layer 6 and buffer layer 4, and/or that the introduction of the third gaseous starting material decreases the damping value of a high-frequency damping.

A layer sequence which is characterized in that a nucleation layer 3 comprised of elements of the main groups III and V is deposited on a surface 2 of a substrate 1 comprised of an element of the main group IV, which is doped with an element of the main group IV at least in the region thereof directly adjacent to the surface 2.

A layer sequence which is characterized in that at least one buffer layer 4 is deposited on the nucleation layer 3, on which buffer layer in turn an active layer 6 is deposited, with the result that a two-dimensional electron gas develops on the boundary layer 5 between buffer layer 4 and active layer 6.

All of the disclosed features are (in and of themselves, but also in combination with each other) essential for the purposes of the invention. The content for disclosure of the associated/accompanying priority documents (copy and previous application) is herewith also incorporated in its entirety in the disclosure of the present application, also for the purpose of including features of said documents in claims of the present application. By their features, the subordinate claims characterize standalone inventive advances of the prior art, even without the features of a referenced claim, in particular with a view to filing divisional applications on the basis of these claims. The invention disclosed in each claim may also include one or more of the features described in the preceding description, in particular such features as are identified with reference numbers and/or in the list of reference numbers. The invention further relates to design forms in which individual features of those identified in the preceding description are not realized, in particular to the extent that they are evidently not essential for the respective intended purpose or can be replaced by other means having technically equivalent effect.

LIST OF REFERENCE NUMBERS

1 Substrate
2 Surface
3 Nucleation layer
4 Buffer layer
5 Boundary surface
6 Active layer
7 Reactor
8 Process chamber
9 Susceptor
10 Heating device
11 Gas inlet member

What is claimed is:

1. A method for depositing a nucleation layer (3) comprised of group III and V elements directly onto a surface (2) of a substrate (1) made of a group IV element, the method comprising:
    introducing a first gaseous starting material containing a group III element together with a second gaseous starting material containing a group V element into a process chamber (8) containing the substrate (1) at a process temperature greater than 500° C.;
    at least at a start of the deposition of the nucleation layer (3), feeding a third gaseous starting material containing a group IV element into the process chamber (8) together with the first and second gaseous starting materials; and
    depositing a buffer layer (4) on the nucleation layer (3) and depositing an active layer (6) on the buffer layer (4) in such manner that a two-dimensional electron gas develops on a boundary surface (5) between the active layer (6) and the buffer layer (4),
    wherein a partial pressure and/or mass flow of the third gaseous starting material in the process chamber (8) is chosen so as to result in a dopant concentration between $1\times10^{17}$ and $1\times10^{18}$ cm$^{-3}$, and a decrease in high-frequency damping.

2. The method of claim 1, wherein the process temperature is in a range between 800° C. and 1,200° C.

3. The method of claim 1, wherein a molar ratio of the second gaseous starting material to the first gaseous starting material is in a range between 10 and 5,000.

4. The method of claim 1, wherein feeding of the third gaseous starting material causes an n-dopant concentration of the nucleation layer (3) to be in a range from $1\times10^{17}$ to $1\times10^{18}$ cm$^{-3}$.

5. The method of claim 1, wherein the substrate (1) is made of silicon or germanium, and/or the third gaseous starting material is Si$_n$H$_{2n+2}$, Ge$_n$H$_{2n+2}$, or another gaseous starting material that contains silicon or germanium.

6. The method of claim 1, wherein the group III element is Al and/or the first gaseous starting material is TMAl.

7. The method of claim 1, wherein the main the group V element is nitrogen, and/or the second gaseous starting material is NH$_3$.

8. A layer sequence produced by the method of claim 1, wherein the nucleation layer (3) is doped with the group IV element at least in a region of the nucleation layer (3) directly adjacent to the surface (2) of the substrate (1).

9. The layer sequence of claim 8, wherein the buffer layer (4) is disposed over the nucleation layer (3), the active layer (6) is disposed over the buffer layer (4), and the two-dimensional electron gas is located at the boundary surface (5) between the buffer layer (4) and the active layer (6).

10. The method of claim 2, wherein a molar ratio of the second gaseous starting material to the first gaseous starting material is in a range between 10 and 5,000.

11. A method for depositing a nucleation layer (3) comprised of group III and V elements directly onto a surface (2) of a substrate (1) made of a group IV element, the method comprising:
- introducing a first gaseous starting material containing a group III element together with a second gaseous starting material containing a group V element into a process chamber (8) containing the substrate (1) at a process temperature greater than 500° C.; and
- at least at a start of the deposition of the nucleation layer (3), a third gaseous starting material containing a group IV element is fed into the process chamber (8) together with the first and second gaseous starting materials,
- wherein a partial pressure and/or mass flow of the third gaseous starting material in the process chamber (8) is chosen so as to result in a dopant concentration of not more than $1 \times 10^{18}$ cm$^{-3}$, and wherein the nucleation layer (3) is deposited under total pressures between 30 and 300 mbar.

12. The method of claim 11, further comprising depositing a buffer layer (4) on the nucleation layer (3), and depositing an active layer (6) on the buffer layer (4), in such manner that a two-dimensional electron gas develops on a boundary surface (5) between the active layer (6) and the buffer layer (4).

13. The method of claim 11, wherein the substrate (1) is made of silicon or germanium, and/or the third gaseous starting material is $Si_nH_{2n+2}$, $Ge_nH_{2n+2}$, or another gaseous starting material that contains silicon or germanium.

14. The method of claim 11, wherein the group III element is Al and/or the first gaseous starting material is TMAl.

15. The method of claim 11, wherein the group V element is nitrogen, and/or the second gaseous starting material is $NH_3$.

16. The method of claim 11, wherein the partial pressure and/or the mass flow of the third gaseous starting material in the process chamber (8) is chosen so as to result in a decrease in high-frequency damping.

17. A layer sequence produced by the method of claim 11, wherein the nucleation layer (3) is doped with the group IV element at least in a region of the nucleation layer (3) directly adjacent to the surface (2) of the substrate (1).

18. The layer sequence of claim 17, wherein a buffer layer (4) is disposed over the nucleation layer (3), an active layer (6) is disposed over the buffer layer (4), and a two-dimensional electron gas is located at a boundary surface (5) between the buffer layer (4) and the active layer (6).

* * * * *